(12) United States Patent
Tsai et al.

(10) Patent No.: US 6,791,668 B2
(45) Date of Patent: Sep. 14, 2004

(54) SEMICONDUCTOR MANUFACTURING APPARATUS AND METHOD

(75) Inventors: Kao-Tsair Tsai, Hsinchu (TW); Yasuko Tabata, Kyoto (JP)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/216,878

(22) Filed: Aug. 13, 2002

(65) Prior Publication Data

US 2004/0032577 A1 Feb. 19, 2004

(51) Int. Cl.⁷ .................. G03B 27/72; G03B 27/58; G03B 27/42
(52) U.S. Cl. .............. 355/71; 355/72; 355/53
(58) Field of Search .............. 355/53, 67–76; 430/311, 328

(56) References Cited

U.S. PATENT DOCUMENTS 5,001,039 A    3/1991  Ogoh ................... 430/311
5,760,881 A    6/1998  Miyazaki et al. ......... 355/71
6,403,475 B1   6/2002  Tanabe et al. ........... 438/663
6,642,996 B2 * 11/2003  Nogawa ................. 355/72

FOREIGN PATENT DOCUMENTS

JP    404062457 A    2/1992
JP    405335207 A   12/1993
JP    2001-264626   *  9/2001

* cited by examiner

Primary Examiner—Henry Hung Nguyen
(74) Attorney, Agent, or Firm—Rosenberg, Klein & Lee

(57) ABSTRACT

A semiconductor apparatus and method for upgrading uniformity of critical dimension by compensating the flare effect at wafer edge are disclosed. In one embodiment of the invention, the invention uses an exposure plate mounted on tilt pincettes which can protrude and retract from a wafer stage of a stepper to eliminate the alteration of uniformity of critical dimension at wafer edge. The exposure plate uses the tilt pincettes to tilt along with a wafer so as to keep planar with the wafer.

7 Claims, 4 Drawing Sheets

SEMICONDUCTOR MANUFACTURING APPARATUS AND METHOD

BACKGROUND OF THE INVENTION

1. Field of the Invention

The present invention relates to a semiconductor manufacturing apparatus and method, and more particularly to a semiconductor manufacturing apparatus and a method for upgrading uniformity of critical dimension by compensating the flare effect at wafer edge.

2. Description of the Related Art

The use of optical lithography to pattern devices that are fabricated in a semiconductor wafer (such as a silicon wafer) is well known and has been in practice for many years. Generally, a mask is used in which light penetrating elements present in the mask define a positive or a negative pattern in a photosensitive media such as photoresist. One common practice is to position light reflecting chrome on a transparent mask material, such as glass (or quartz). The light not reflected by the chrome is projected through the mask and projection optics and exposes a photosensitive material (such as a photoresist) to form a latent image therein. Depending on the positive or negative nature of the photoresist employed, one area (the exposed or the unexposed area) is developed and removed. The areas of photoresist that were removed exposes the underlying substrate areas which are then processed by various techniques, including etching and ion implantation, which in conjunction with deposition techniques form device features, such as gates, interconnects, etc. The photoresist remaining on the surface functions as a mask when the underlying layer is processed.

Uniformity of integrated circuit (IC) features' critical dimensions or CD is necessary to achieve highest possible IC performance. One factor that affects critical dimension's uniformity on wafers is scattered light that reach the photoresist layers of the wafers. Scattering is a well-known physical phenomena that degrades the image being formed at the target. Essentially, any light that does not propagate along the line defined by physical diffraction direction is regarded as scattered light. Scattering has also been referred to as optical noise or flare. Although scattering is undesirable, it is appreciated that some amount of scattering will always be present with the diffraction limited conventional microlithography technique. There are many causes of scattering in the lithography tool, some due to the process and others due to the tool itself. Some sources of scattering are still not well understood.

However, what is known is that the CD for a photosensitive medium may vary across its area, when formed through a microlithography process. Whether this variation in the CD is due to light scattering alone or combined with other factors, the variations are undesirable. Since the size of the resist features (such as gate or trench openings of an integrated circuit device) will depend on the combined dose produced by diffracted and scattered light in the exposed photoresist, the extent of the exposure difference on the photoresist pattern across the field of the image plane can result in feature size variations for the integrated circuit. Such variations in the feature (component and wiring) differences are undesirable, since performance of the integrated circuit may be impacted. For example, sizeable difference in the width of wiring lines can result in signal current variations.

Sizeable difference in the width of wiring line or line width is more crucial and found worse as device dimensions reduce further. Particularly, when device dimensions reduce to about 0.13 micron by using an ArF (Argon Fluoride) light source having a wave length of about 193 nanometer, flare effect or scattering of such a short-wavelength light would be a serious problem since the dose is vary small and any exposure energy difference would apparently alter tiny dimension feature and produce non-uniform circuit pattern or degrade uniformity of critical dimension. FIGS. 1–5 show how and where the flare effect affect uniformity of critical dimension on semiconductor wafers. FIG. 1 shows a diagram of line width versus exposure dose on wafers. Three stepping pitches of exposure set in a stepper are used to draw this figure. As shown in FIG. 1, smaller stepping pitch produces larger line width while a single dose is set. FIG. 2 shows how uniformity of critical dimension varies at wafer edge across a wafer. According to the phenomenon disclosed in FIG. 2, one can rationally expect that it is the flare effect, which induces the alteration of uniformity of critical dimension at wafer edge. FIG. 3 discloses how the scattered light exposes each die and increases the exposure dose on the neighboring dies of each die. The alteration of CD at wafer edge can be explained by studying FIGS. 3–5. As shown in FIG. 3, each die 102 is exposed by scattered light 104 and also receives scattered dose from scattered light 104 exposing neighboring dies except those at wafer edge. Furthermore, the source of the phenomenon disclosed in FIG. 2 can be understood further by studying FIGS. 4 and 5. In FIG. 4, a light source exposes wafer 204 on tilt pincettes 206 through lens 202. Tilt pincette 206 is disposed at wafer stage 208 and is adjustable to tilt a wafer. In FIG. 5, those dies at wafer edge which have less than four neighboring dies obviously would have alteration of CD since they receive less scattered dose from scattered light exposing neighboring dies.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to provide a semiconductor manufacturing apparatus and a method for upgrading uniformity of critical dimension by compensating the flare effect at wafer edge.

It is another object of this invention to provide a semiconductor manufacturing apparatus and a method for upgrading the yield ratio of production.

It is a further object of this invention to provide a semiconductor manufacturing apparatus and a method for compensate the flare effect of edge shot (exposure).

To achieve these objects, and in accordance with the purpose of the invention, the invention uses a semiconductor apparatus of a wafer stage for upgrading uniformity of critical dimension. The apparatus comprises means for supporting and tilting a wafer so that the wafer can be mounted on the wafer stage to be exposed in a photolithography process and means for blocking and receiving an illumination light around the circumference of the wafer mounted on the wafer stage by said means for supporting and tilting a wafer.

In another embodiment of this invention, the apparatus comprises means for blocking and receiving a illumination light around the circumference of a wafer which can be tilted and exposed along with the wafer in a photolithography process and means for mounting and tilting said means for blocking and receiving an illumination light on the wafer stage.

The invention also provides a method for upgrading uniformity of critical dimension in a photolithography process. The method comprises the following steps. First of all, a wafer on a wafer stage of a stepper is provided. Then an exposure plate circling around the wafer is provided. Finally, the wafer and the exposure plate are exposed.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1:
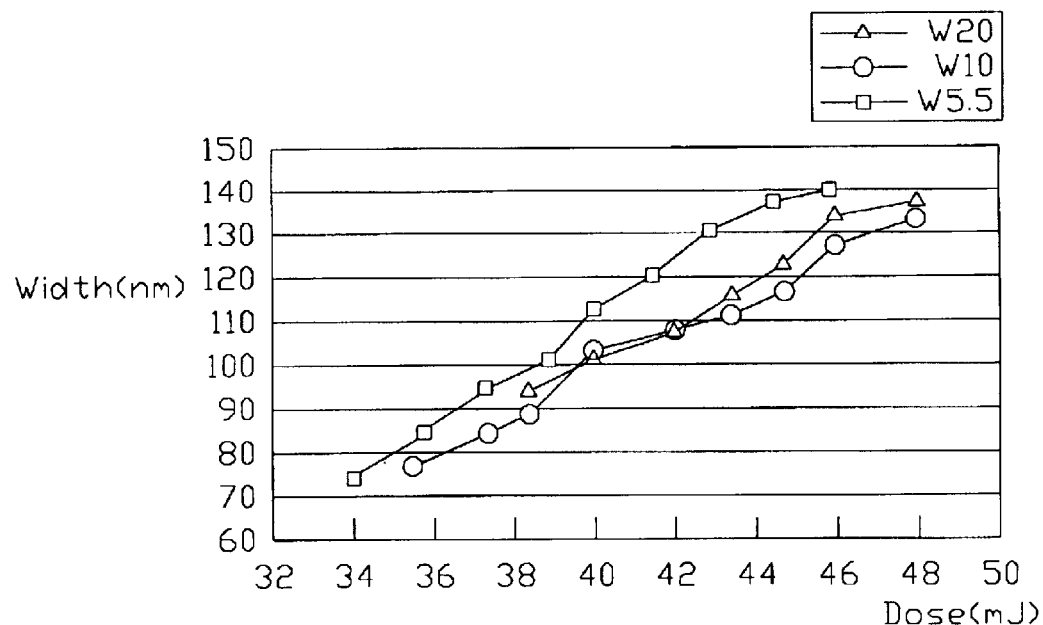
FIG. 1 shows a diagram of line width versus exposure dose on wafers.
Figure 2:
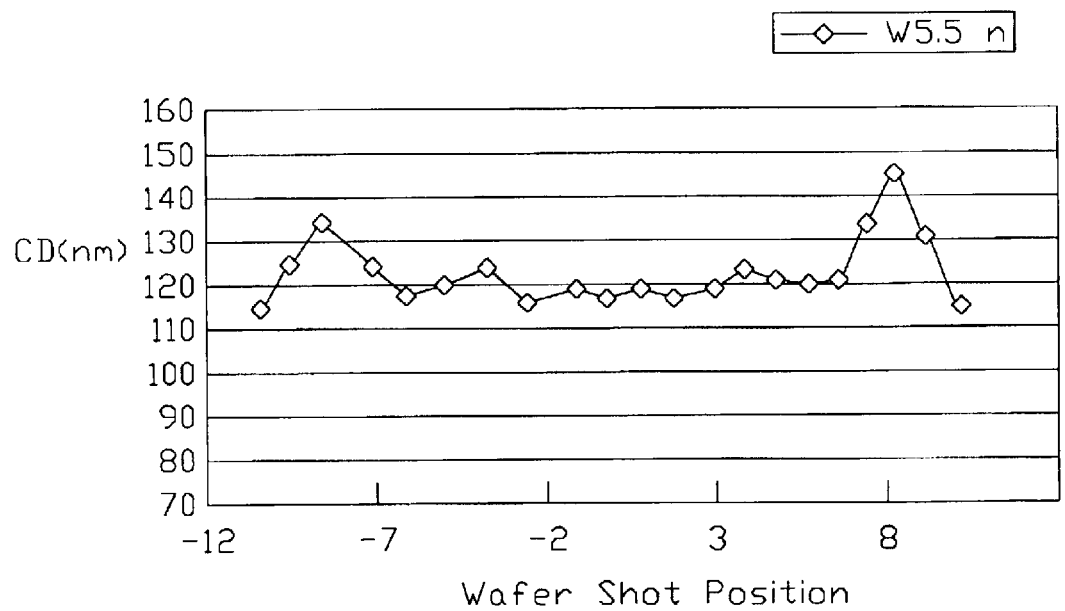
FIG. 2 shows how uniformity of critical dimension varies at wafer edge across a wafer.
Figure 3:
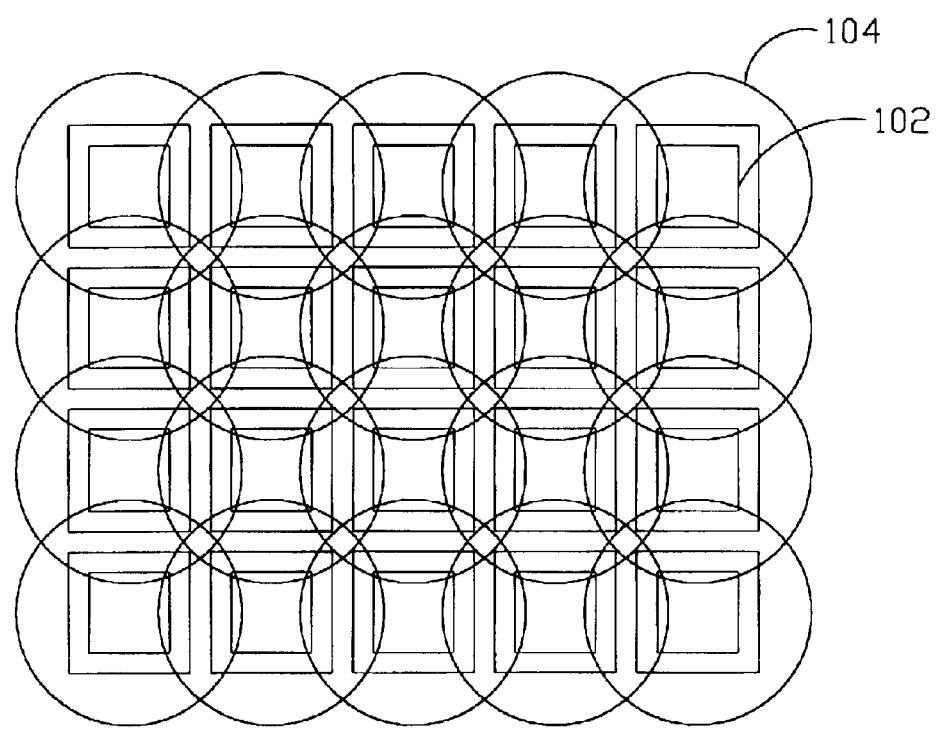
FIG. 3 discloses how the scattered light exposes each die and increases the exposure dose on the neighboring dies of each die.
Figure 4:
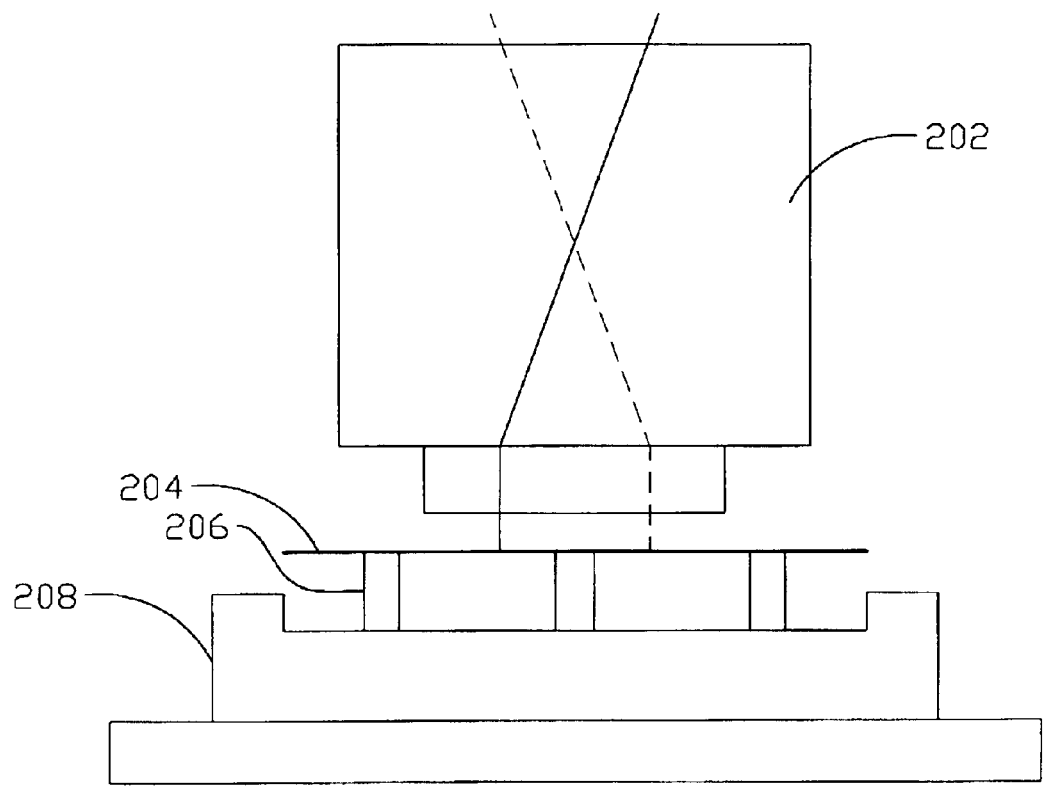
FIG. 4 shows a light source exposing a wafer on tilt pincettes through a lens.
Figure 5:
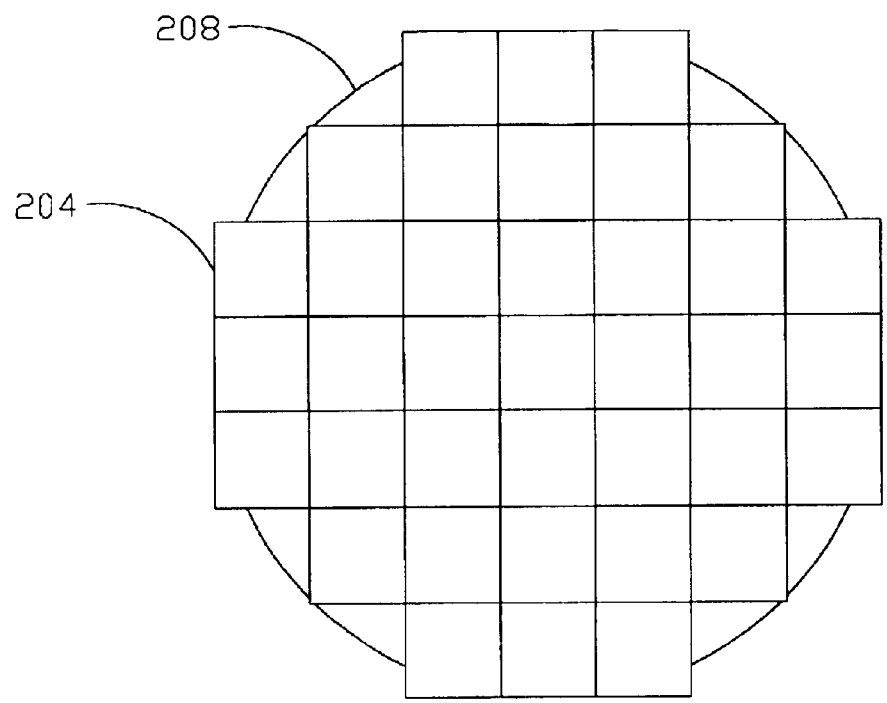
FIG. 5 shows the top view of the wafer in FIG. 4.
Figure 6:
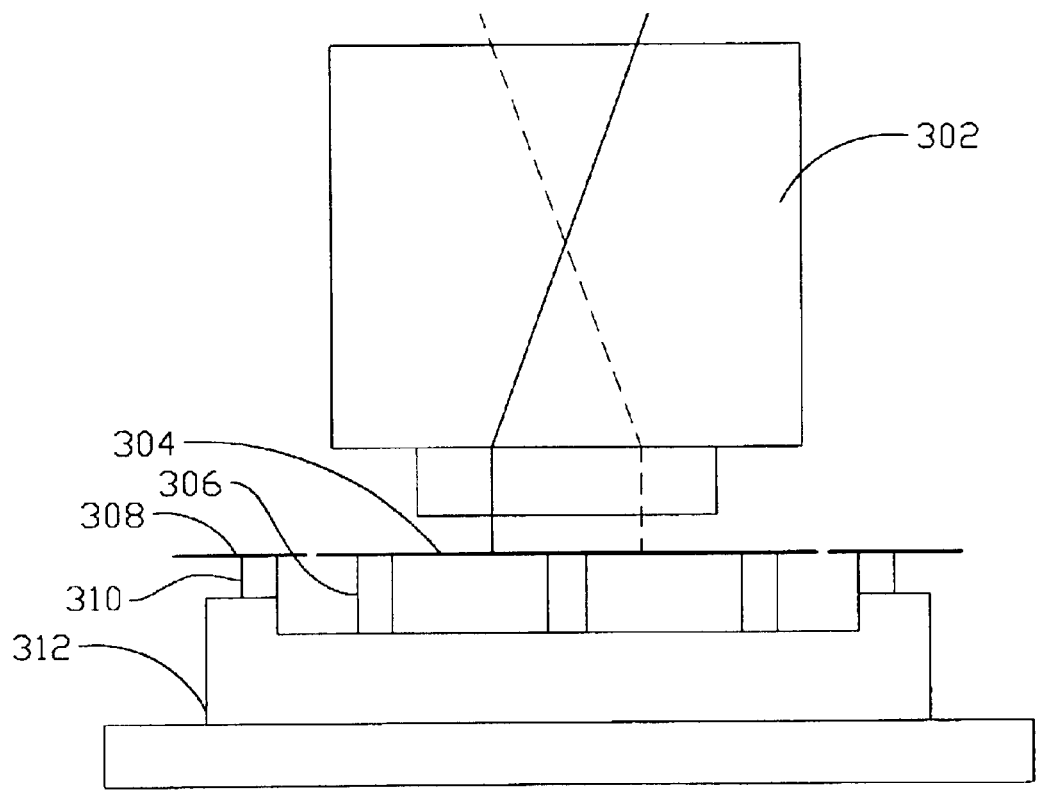
FIG. 6 shows a wafer stage apparatus of this invention.
Figure 7:
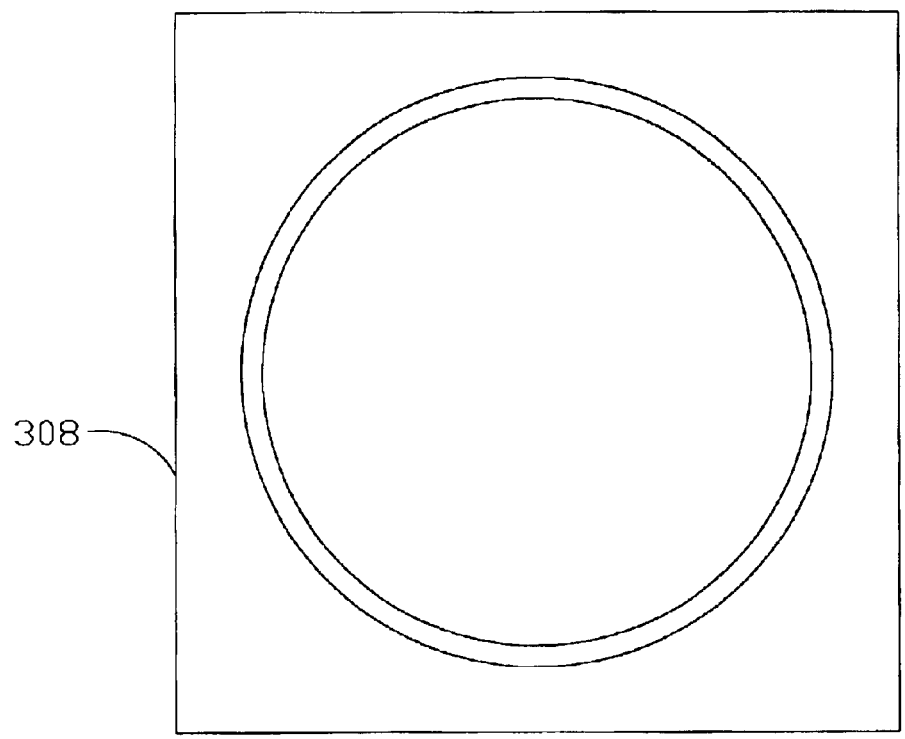
FIGS. 7 and 8 shows the top view of the exposure plate of the wafer stage apparatus and the wafer placed thereon shown in FIG. 6.
Figure 8:
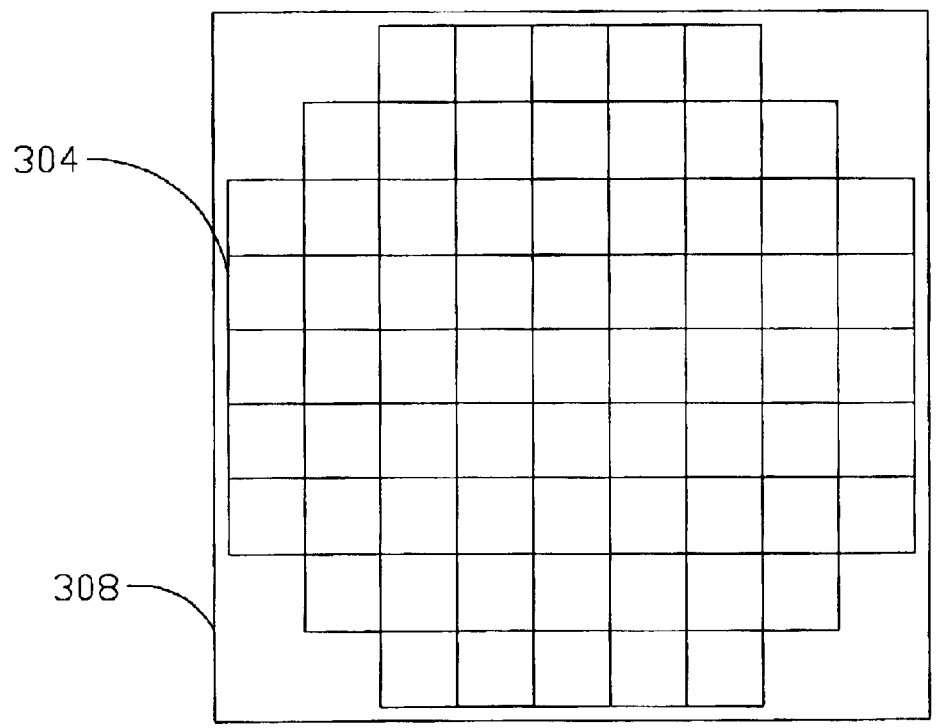

Referring to FIG. 6, a wafer stage apparatus of this invention is shown. A light source exposes a wafer 304 placed on tilt pincettes 306 through a lens 302. The tilt pincettes 306 can protrude from and retract to a wafer stage 312. An exposure plate 308 is placed on tilt pincettes 310. The exposure plate 308 is used to block the illumination light from the light source and receive the scattered light. The tilt pincettes 310 can protrude from and retract to the wafer stage 312 together with tilt pincettes 306 such that the exposure plate 308 keeps planar with the wafer 304 which could be tilted if necessary. FIGS. 7 and 8 shows the top view of the exposure plate 308 and the wafer 304. Because the exposure plate 308 can serve as neighboring dies receiving scattered light and balancing the flare effect for those dies at wafer edge, uniformity of CD of those dies at wafer edge can be upgraded or the alteration of CD at wafer edge can be eliminated.

The exposure plate 308 can be, for example, a flat plate with a surface of SiC film or $SiO_2$ film. The exposure plate 308 can be any means for blocking and receiving the illumination light from the light source that tilts together with the wafer 304. The tilt pincettes 310 can be identical to the tilt pincettes 306 that can protrude from and retract to the wafer stage 312, but also could be any means for tilting the exposure plate 308 together with the wafer 304 such that the exposure plate 308 keeps planar with the wafer 304. While performing stepping exposure, the illumination light exposes not only every die of the wafer 304, but also the exposure plate 308. For example, to compensate the flare effect at wafer edge, exposure shots are extended around the wafer 304. That is, dummy exposure shots are performed adjacent those dies at wafer edge so as to render those dies being exposed evenly and eliminate the alteration of uniformity of CD at wafer edge. As shown in FIG. 8, every normal exposure shot at wafer edge is enclosed by dummy exposure shots.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A semiconductor apparatus of a wafer stage for upgrading uniformity of critical dimension, said apparatus comprising:

means for supporting and tilting wafer so that a wafer can be mounted on the wafer stage to be exposed in a photolithography process; and means for blocking and receiving an illumination light disposed in non-overlapped manner around the circumference of the wafer mounted on the wafer stage and kept coplanar with said wafer by said means for supporting and tilting a wafer;

wherein said means for blocking and receiving the illumination light comprises tilt pincettes which can protrude and refract from the wafer stage.

2. The apparatus according to claim 1, wherein said means for blocking and receiving an illumination light comprises a planar plate having a silicon dioxide film thereon.

3. A semiconductor apparatus of a wafer stage for upgrading uniformity of critical dimension, said apparatus comprising:

means for blocking and receiving an illumination light disposed in non-overlapped manner around the circumference of a wafer which can be tilted and exposed along with the wafer and kept coplanar with the wafer in a photolithography process; and independent first and second means for respectively mounting and tilting said wafer and said means for blocking and receiving an illumination light on the wafer stage.

4. The apparatus according to claim 3 wherein said means for blocking and receiving an illumination light comprises a planar plate having a silicon carbide film thereon.

5. The apparatus according to claim 3, wherein said mounting and tilting said means for blocking and receiving an illumination light comprises tilt pincettes which can protrude and retract from the wafer stage.

6. A method for upgrading uniformity of critical dimension in a photolithography process, said method comprising:

providing a wafer on a wafer stage of a stepper having means for supporting and tilting a wafer comprising tilt pincettes which can protrude and retract from the wafer stage;

providing an exposure plate circling in non-overlapped manner around and coplanar with said wafer for blocking and receiving an illumination light from a light source of the stepper; and exposing on said wafer and said exposure plate;

wherein said exposure plate comprises tilt pincettes which can protrude and retract from the wafer stage.

7. The apparatus according to claim 1, wherein said means for supporting and tilting a wafer comprises tilt pincettes which can protrude and retract from the wafer stage.

* * * * *